United States Patent [19]

Peled et al.

[11] Patent Number: 4,633,196

[45] Date of Patent: Dec. 30, 1986

[54] DELTA MODULATOR/DEMODULATOR WITH IMPROVED TRACKING OF RAPIDLY VARYING WAVEFORMS

[75] Inventors: Nahum Peled, Rishon Le-Zion; Shmuel Frenkel, Azor, both of Israel

[73] Assignee: Motorola, Inc., Schaumburg, Ill.

[21] Appl. No.: 724,387

[22] Filed: Apr. 18, 1985

[30] Foreign Application Priority Data

Apr. 19, 1984 [GB] United Kingdom ................. 8410350

[51] Int. Cl.⁴ .......................... H03K 7/00; H03K 9/00
[52] U.S. Cl. .................................. 332/11 D; 329/104; 375/27; 375/94
[58] Field of Search ....................... 329/104, 106, 107; 332/11 D; 375/27, 28, 29, 94

[56] References Cited

U.S. PATENT DOCUMENTS 3,706,944 12/1972 Tewksbury ...................... 332/11 D
3,748,586 7/1973 Johnson et al. ..................... 329/104

OTHER PUBLICATIONS

Motorola data book, "Linear Interface Integrated Circuits", 1979—relating to a continuously variable slope delta modulator/demodulator integrated circuit (MC3417, MC3517, MC3418, MC3518).

Primary Examiner—Eugene R. LaRoche
Assistant Examiner—James C. Lee
Attorney, Agent, or Firm—Charles L. Warren; Donald B. Southard

[57] ABSTRACT

In a delta modulator/demodulator incorporating continuously variable slope circuitry (8, 9, 10), the current passed to an integrator (3) to increase its gain, is squared by a squaring circuit (13) in order to increase the sensitivity of the modulator/demodulator to fast rising and falling waveforms and high frequencies.

5 Claims, 5 Drawing Figures

DELTA MODULATOR/DEMODULATOR WITH IMPROVED TRACKING OF RAPIDLY VARYING WAVEFORMS

This invention relates to a delta modulator/demodulator and particularly to a continuously variable slope delta modulator/demodulator.

BACKGROUND ART

In a known delta modulator for digitally encoding analogue singals, a comparator compares an input analogue signal with a feedback signal derived from an integrator. The comparator provides an output which reflects the sign of the difference between the analogue input voltage and the integrator output voltage. This sign bit derived from the output of the comparator is sampled and fed to an output terminal as digitised data. The sign bit output obtained from the sampling circuit controls by means of a slope polarity switch, the direction of ramp in the integrator.

A demodulator for signals which have been digitally encoded using a delta modulator is essentially very similar to the circuit of the modulator the only differences being that the digitally encoded data is fed directly into the sampler circuit and demodulated analogue signals are obtained at the output of the integrator. There is therefore no comparator in the demodulator circuit.

Although the delta modulator circuit has the advantage of being very simple and provides digitally encoded data in serial format at its output, it is limited in its ability accurately to track the analogue input signal. Ideally the output of the integrator should accurately follow the input analogue signal.

An improvement to the basic circuit may be provided by using so called continuously variable slope circuitry which provides increased dynamic range by adjusting the gain of the integrator.

The output of the sampler circuit is monitored and in dependence upon this output the ramp current fed to the integrator is increased or decreased in order to produce better tracking of the output of the integrator. In one form of continuously variable slope circuitry the output of the sampler circuit is monitored to determine the occurence of a predetermined number of one or zero bit outputs, typically a string of three or four ones or zeros. A typically known continuously variable slope delta modulator/demodulator of this type is the Motorola MC3517 integrated circuit.

Although the use of a continuously variable slope circuit in a delta modulator/demodulator provides improved performance and dynamic range the modulator/demodulator may still respond too slowly to follow fast rising and falling waveforms and high frequencies.

It is known to use resistor-diode networks in order to increase the ramp voltage fed back to the integrator but for many applications such networks do not give adequate tracking performance. It is not possible to obtain smooth control of the slope of the ramp in the integrator, the diode-resistor networks providing a stepwise adjustment. Also since the characteristic of diodes is strongly affected by temperature the correction provided by the diode-resistor networks is also strongly temperature dependent. This may result in relatively poor fidelity of the reconstructed waveform at the output of the integrator.

This invention seeks to provide a delta modulator/demodulator in which at least some of the above mentioned disadvantages are mitigated.

BRIEF DESCRIPTION OF THE INVENTION

In accordance with the present invention a ramp signal fed to the integrator is fed through a squaring circuit which in a preferred embodiment is formed by an X-Y multiplier connected to receive the same voltage at its X and Y inputs.

BRIEF DESCRIPTION OF THE DRAWINGS

An exemplary embodiment of the invention will now be described with reference to the drawings in which.

DETAILED DESCRIPTION OF THE INVENTION

Figure 1:
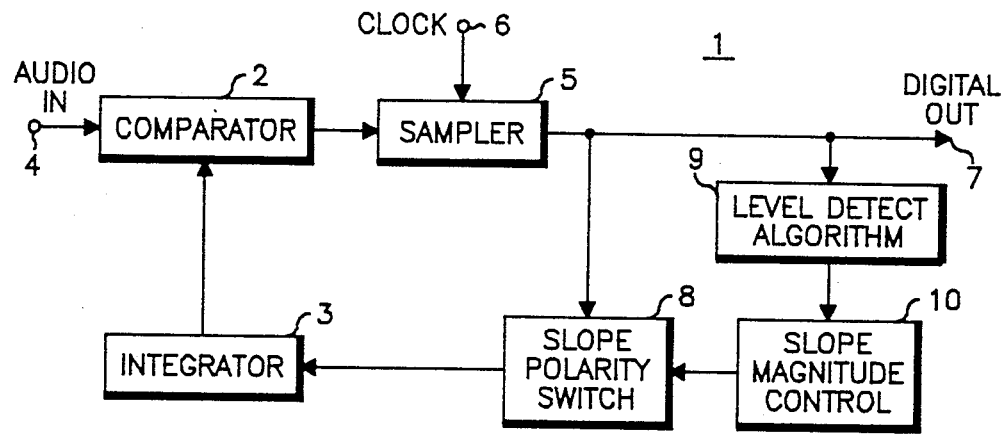
FIG. 1—is a block diagram of a known delta modulator encoder.

Referring now to FIG. 1 the delta modulator illustrated comprises a control loop 1 including a comparator 2 in its forward path and an integrator 3 in the feedback path. Analogue input signals received at an input terminal 4 are fed to one input of the comparator 2 where they are compared with the integrator output fed to the second input of the comparator.

The comparator provides an output which reflects the sign of the difference between the analogue input voltage and the output voltage of the integrator 3. The sign bit is sampled by means of a sampler circuit 5 which is clocked at the bit rate, typically 16 or 32K bits/s by means of a clock signal fed to a clock input terminal 6. The output of the sampler 5 is a digitally encoded version of the analogue signal received at the input terminal 4 and this output appears at an output terminal 7 of the delta modulator encoder circuit.

The digital output of the sampler circuit 5 is also used to control a slope polarity switch 8 which controls the direction of current fed to the integrator 3.

The delta modulator also includes continuously variable slope circuitry which monitors the digital output and adjusts the magnitude of the current fed into the integrator 3 in order to increase the dynamic range of the modulator.

In the embodiment illustrated in FIG. 1 this continuously variable slope circuitry includes a level detection circuit 9 which detects the occurrence of a number, typically 3 or 4, of consecutive bits of the same sign. The output of the level detect circuit 9 is sensed by a slope magnitude control circuit 10 which controls the current which is fed via the slope polarity switch 8 to the integrator 3.

The slope magnitude control circuit is essentially a filter known as a Syllabic filter and the level detect circuit provides an output voltage which is operative to adjust the current fed by the filter to the integrator 3.

Figure 2:
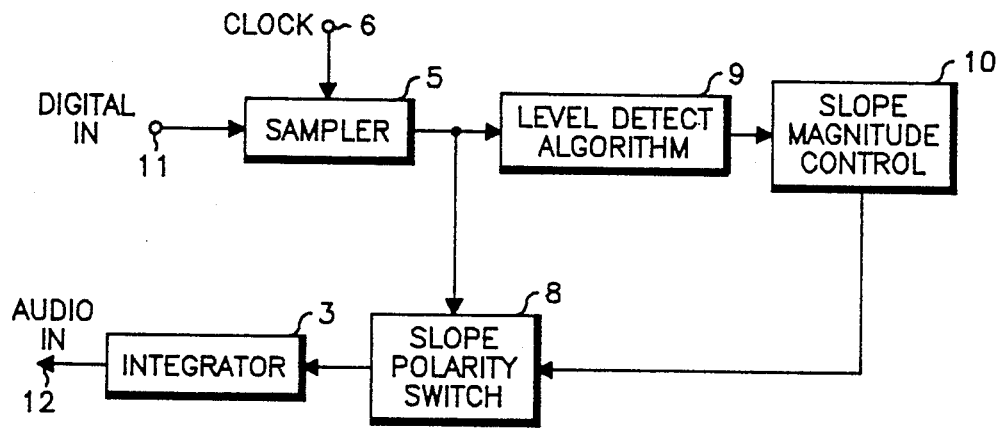
FIG. 2—is a block diagram of a known demodulator decoder.

Referring now to FIG. 2 where like parts to those in FIG. 1 bear like reference numbers there is illustrated a delta demodulator decoding circuit. The circuit differs from the encoding circuit only by the absence of a comparator. Digital signals to be demodulated and received at a terminal 11, are fed directly to the clocked sampling circuit 5 and analogue output signals are delivered at an output terminal 12 of the integrator 3.

Figure 3:
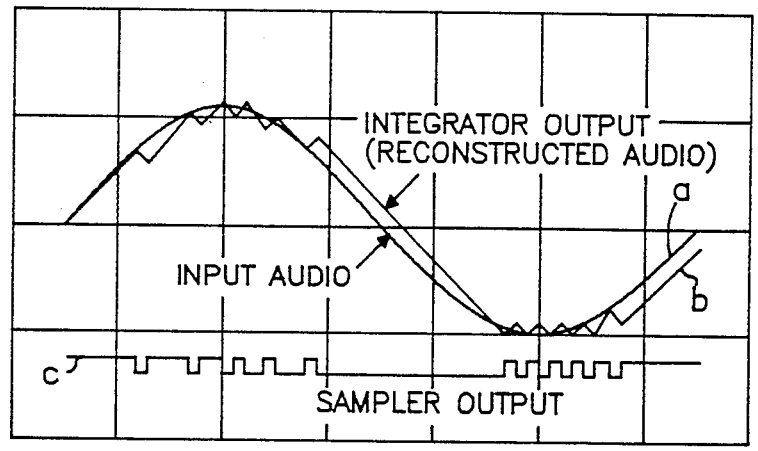
FIG. 3—illustrates waveforms occuring in the emcoder and decoder of FIGS. 1 and 2 respectively.

Referring to FIG. 3 there is shown waveforms appearing in the encoding and decoding circuits of FIGS. 1 and 2 respectively. Sinewave a illustrates schematically, an analogue input signal fed to the comparator 2 of FIG. 1 whilst curve b illustrates the output of the integrator 3 which, in the case of the encoder circuit is fed back to the comparator 2, and in the case of the decoder circuit constitutes the reconstructed analogue signal. Digital output signals provided by the sampler 5 are illustrated by waveform c.

As explained above the problem with the known modulator/demodulator circuits is that they are unable to follow sufficiently accurately fast rising and falling waveforms and high frequencies.

These problems are mitigated in a delta modulator/demodulator in accordance with the invention in which a squaring circuit is included in the current path to the integrator in order to increase the response capabilities of the circuit to fast rising and falling waveforms and high frequencies.

Figure 4:
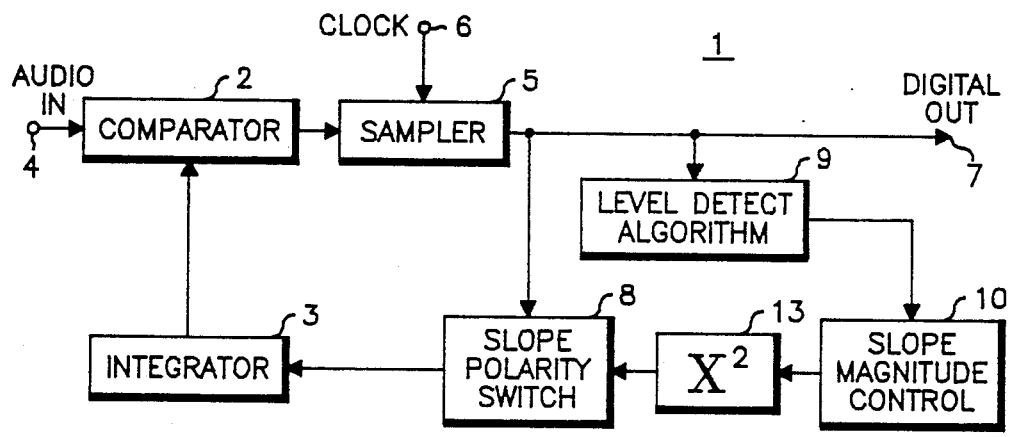
FIG. 4—shows a delta modulator in accordance with the present invention.

Referring now to FIG. 4 there is shown a preferred embodiment of a delta modulator in accordance with the invention. Like parts to those in FIG. 1 bear like reference numbers.

Figure 5:
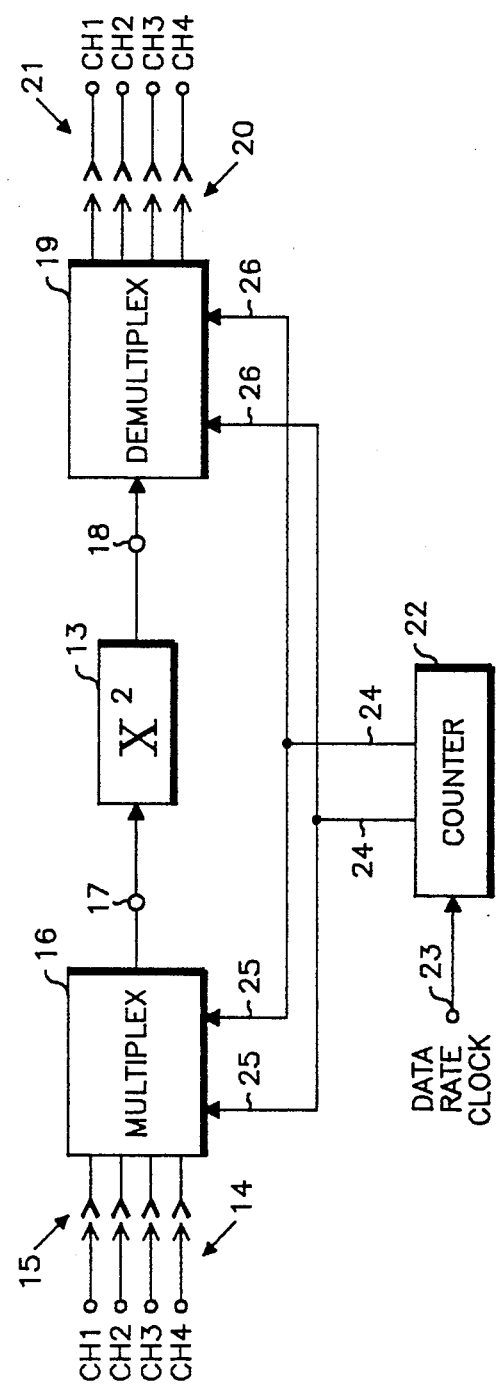
FIG. 5—illustrates an alternative embodiment of the invention.

In FIG. 5 a squaring circuit 13 is provided between the slope magnitude control circuit 10 and the slope polarity switch 8. Whenever the level detection circuit 9 causes the slope magnitude control circuit 10 to feed an increased current into the integrator 3 the actual value of the integrator current will be the square of this increased current value. By squaring the current fed to the integrator 3 the sensitivity of the loop 1 to slope changes is greatly increased and the output of the integrator 3 is thereby able to track fast varying wave forms much more closely.

In a preferred embodiment of the invention, in order to achieve an accurate square law the squaring circuit is implemented by an X-Y multiplier connected so that the same voltage is fed to the X and Y inputs. The squaring circuit 13 may be implemented by a commercially available X-Y multiplier in the form of a Motorola MC1495 integrated circuit.

A delta demodulator in accordance with a feature of the invention may be implemented in similar manner by including a squaring circuit in the current path to the integrator 3 of the demodulator circuit and conveniently located between the slope polarity switch 8 and the slope magnitude control circuit 10 of the demodulator circuit.

Data is often required to be transmitted over a plurality of channels each of which requires the use of a modulator and a demodulator circuit. In accordance with a feature of the present invention, in order to save material, hardware and labour, a squaring circuit may be time shared by each of a plurality of modulator/demodulator circuits. Time sharing may be implemented using an analogue multiplexer which is switched at a high rate, typically at the data sampling rate.

In FIG. 5 there is illustrated a single squaring circuit 13 which is time shared between a plurality, in this example four, channels each of which may form part of the control loop of modulator or demodulator circuit. The four channels 14 are fed to respective inputs 15 of a multiplexer circuit 16, which connects each channel in turn to an output terminal 17.

The output terminal 17 is coupled to the squaring circuit 13, the output of which is connected to the input terminal 18 of a demultiplexer circuit 19. The demultiplexer circuit 19 connects the input terminal 18 sequentially to each of its four output terminals 20 which feed each of four channels 21 which are coupled to respective integrators. Capacitors (not shown) are connected between each output 20 and ground. The multiplexer and demultiplexer circuits are conveniently formed by Motorola MC14052 integrated circuits.

The multiplexer 16 and the demultiplexer 19 are each controlled by means of a two bit counter 22 which is clocked at the data rate by means of a clock signal fed to a clock input 23. The counter 22 has a pair of outputs 24 which are coupled to respective inputs 25 of the multiplexer 16 and inputs 26 of the demultiplexer 19.

The counter 22 provides at its two outputs 24, four different combinations of two bits to control the connection of each of the four channels 14, of the multiplexer 16, to the output 17 of that multiplexer, and the input 18 of the demultiplexer 19 to each of the four outputs 20 of that demultiplexer. The counter 22 may conveniently be formed by a Motorola MC14027 integrated circuit.

Modifications may be made to be the described embodiments without departing from the scope of the invention. For example the invention is not limited to any particular level detection algorithm for the level detect circuit 9. Any convenient circuit may be employed for generating the integrator current which is fed through the squaring circuit 13.

We claim:

1. A delta modulator/demodulator comprising:
 a sampler circuit for providing a clocked digital output signal;
 an integrator circuit for integrating a ramp signal whose sign is dependent on said clocked digital output signal so as to provide an analogue signal; and
 continuously variable slope circuitry for providing said ramp signal and including means for monitoring said clocked digital output signal and for providing an output signal dependent thereon, means responsive to said output signal for generating said ramp signal having a slope dependent on said output signal, and squaring means for squaring said ramp signal, whereby the sensitivity of the variable slope circuitry is increased such that said analogue signal provided by said integrator circuit has a faster response to said clocked digital output signal.

2. A delta modulator/demodulator according to claim 1 wherein said squaring means comprises an X-Y multiplier circuit connected to receive the same ramp signal at both the X and Y inputs.

3. A data transmission system having a plurality of channels, each channel having a delta modulator/demodulator comprising:
 a sampler circuit for providing a clocked digital output signal;
 an integrator circuit for integrating a ramp signal whose sign is dependent on said clocked digital output signal so as to provide an analogue signal; and
 continuously variable slope circuitry for providing said ramp signal and including means for monitoring said clocked digital output signal and for providing an output signal dependent thereon, and means responsive to said output signal for generating said ramp signal having a slope dependent on said output signal;

the data transmission system further comprising squaring means for squaring said ramp signal whereby the sensitivity of the variable slope circuitry is increased such that said analogue signal provided by said integrator circuit has a faster response to said clocked digital output signal, and means for time-sharing said squaring means between each of said delta modulator/demodulators.

4. A data transmission system according to claim 3 wherein the time-sharing means comprises an analogue multiplexer and a demultiplexer which are switched at a predetermined rate and have said squaring means connected therebetween.

5. A data transmission system according to claim 4 wherein said multiplexer and demultiplexer are switched at the data sampling rate.

* * * * *